United States Patent

Grace

[15] 3,646,581

[45] Feb. 29, 1972

[54] SEMICONDUCTOR DIODE HIGH-FREQUENCY SIGNAL GENERATOR

[72] Inventor: Martin I. Grace, Framingham, Mass.

[73] Assignee: Sperry Rand Corporation

[22] Filed: Mar. 9, 1970

[21] Appl. No.: 17,673

[52] U.S. Cl. ................................330/56, 330/53, 333/73 C

[51] Int. Cl. ........................................................N03f 3/60

[58] Field of Search ..........................330/56; 333/73 C, 73 R

[56] References Cited

UNITED STATES PATENTS 3,467,907 9/1969 Aitchison et al. ....................330/56 X 3,328,670 6/1967 Parker................................33/73 CX

FOREIGN PATENTS OR APPLICATIONS 167,637 6/1954 Australia ................................330/56

*Primary Examiner*—Nathan Kaufman

*Attorney*—S. C. Yeaton

[57] ABSTRACT

A microwave or high-frequency amplifier or frequency converter is disclosed which exploits avalanche phenomena in a semiconductor diode placed in a multiply tuned transmission line circuit. The novel configuration features means substantially avoiding loss of power within the circuit until high-frequency or microwave input energy is fed into the circuit, whereupon power is then efficiently amplified or converted within the circuit.

8 Claims, 4 Drawing Figures

INVENTOR
MARTIN I. GRACE
BY
H P Terry
ATTORNEY

INVENTOR
MARTIN I. GRACE
BY
H P Terry
ATTORNEY

SEMICONDUCTOR DIODE HIGH-FREQUENCY SIGNAL GENERATOR

BACKGROUND OF THE INVENTION

1. Field of the Invention

The invention pertains to the art of generation of microwave or high-frequency signals in transmission line devices. More particularly, the invention pertains to means for the amplification of or frequency conversion or multiplication of such microwave or high-frequency signals with simple, compact, and inexpensive transmission line elements and active elements such as semiconductor diodes without dissipation of energy in the quiescent state of the device.

2. Description of the Prior Art

Fundamental high-frequency oscillations have often been observed in systems combining cavity or other resonators or high-frequency transmission lines with semiconductor diodes exhibiting useful negative resistance effects when placed in suitable bias fields. Such fundamental frequency oscillations have been observed, for instance, in both silicon and germanium diodes under pulsed as well as under continuous wave operation. Diodes having abrupt PN junctions have, for example, been used in such circuit configurations. Efficiencies of fundamental signal generation from very low values to as high as 40 percent have been demonstrated with continuous wave operation of such diode oscillators.

Efficient generation of useful harmonic energy in similarly arranged uncomplex circuits has not advanced conspicuously. In part, the problem has been associated with devising suitable means of independently matching, tuning, and otherwise adjusting the individual parts of the circuit in which fundamental and harmonic signals mutually or separately flow. In part, there have also been problems traceable to the nature of the negative resistance properties of semiconductor diodes, some of which occur only in the environment of a microwave field. In the case of diodes exhibiting avalanche effects, certain parametric effects also may be present. Furthermore, these characteristics are not always stable in nature and appear and interact in unpredictable ways. Low conversion efficiencies and difficult cooling requirements of prior art diodes have also had to be considered.

SUMMARY OF THE INVENTION

The invention is a microwave or high-frequency signal amplifier or frequency converter employing a high-efficiency mode semiconductor diode as an active negative resistance device in a multiply tuned transmission line circuit of the coaxial type. The coaxial circuit is terminated by the semiconductor diode. Impedance matching devices, consisting of sections of low impedance transmission line and located between the diode and an external load, are used to adjust the circuit for efficient operation. In operation, a unidirectional potential is applied across the high-efficiency mode semiconductor diode such that it is biased close to its breakdown level. The high-frequency or microwave signal, when superimposed upon the bias, produces large changes in the instantaneous diode voltage and current, which changes are such that a large pulsating negative resistance is generated at the same frequency as the applied high-frequency signal. The current wave contains many harmonic components which may be coupled to an oscillating harmonic high-frequency field to produce amplified harmonic signals.

DESCRIPTION OF THE PREFERRED EMBODIMENT

Figure 1:
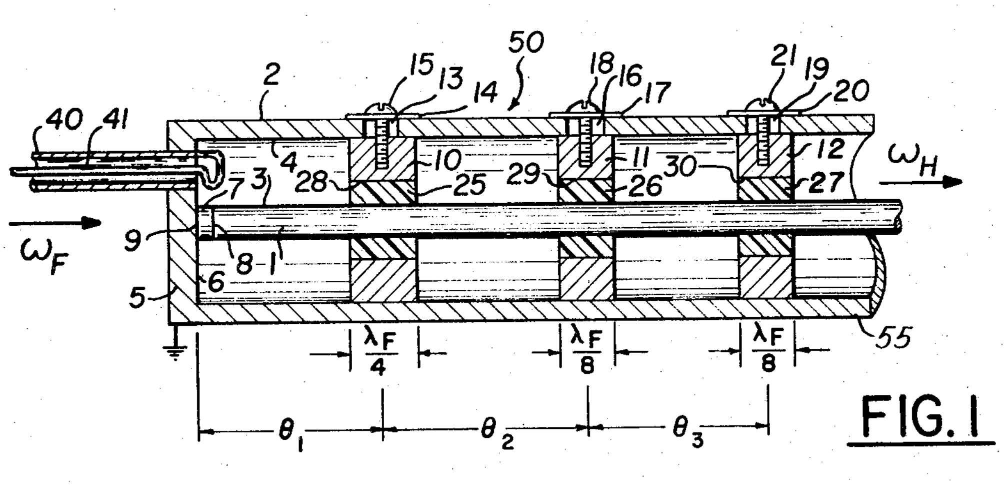
FIG. 1 is a cross section view of the preferred embodiment of the invention.

FIG. 1 shows a signal converter or amplifier and frequency multiplier 50 according to the present invention comprising a coaxial transmission line section with an electrically conducting inner rod-shaped conductor 1 surrounded concentrically by a metal tube 2 having a similar good electrical conducting character. As is usual in high-frequency circuits, it is primarily the respective current carrying surfaces 3 and 4 of rod 1 and of tube 2 that have good electrical conductivity for high-frequency electrical currents. Tube 2 is closed by a metallic end or short circuiting wall 5 which may be formed integrally therewith and which has a highly conducting inner surface 6. The transmission line 50 comprising conductor rod 1 and tube 2 is further terminated by a semiconductor diode 7, one electrode surface of which is conductively bonded in known fashion at surface 8 to inner conductor rod 1. A second surface of diode 7 is similarly conductively bonded at portion 9 of surface 6 on end plate 5.

At certain intervals within the above described structure are placed adjustable impedance matching or transforming elements 10, 11 and 12. Matching or transforming element 10, for instance, comprises a solid ring of electrically conductive metal with an outside diameter permitting it to be moved longitudinally within tube 2 in contact with surface 4. A short longitudinal slot 13 through the wall of tube 2 permits element 10 to be adjusted and then to be fixed in position by tightening a screw 15 against washer 14, screw 15 being threaded into a mating threaded hole in element 10. The position of the similarly formed impedance transform element 11 may also be adjusted longitudinally and then fixed in position by virtue of a slot 16, washer 17, and a screw 18 which is threaded into element 11. A third and similarly formed impedance transforming element 12 cooperates in the same manner with a slot 19, washer 20, and screw 21 and may be similarly adjusted in position and then fixed. It should be observed that impedance matching or transforming elements 10, 11, and 12 are in themselves known devices and individually operate generally as they have in past usage. In the present invention, they cooperate in an unusual manner which is yet to be explained. They may, of course, be adjusted in position and then permanently fixed in place, as by soldering.

Impedance transformer ring elements 10, 11, 12, have a second function: namely, they provide support for center rod conductor 1 with respect to outer tubular conductor 2. For example, transformer ring 10 surrounds a ring of low-loss dielectric material, bonded to it at surface 28 by any of several well-known methods, and free to slide on the surface 3 of inner rod conductor 1. Similarly, transformer elements 11 and 12 respectively surround low-loss dielectric rings 26 and 27 and are respectively bonded at surfaces 29 and 30 of transformer elements 11 and 12. Similarly, dielectric rings 26 and 27 are free to slide on the surface 3 of inner conductor 1.

A coaxial line input feed consisting of an inner conductor 41 and an outer conductor 40 is fastened through an aperture in wall 5 to afford excitation of coupling loop 35 and of the transmission line comprising conductors 1 and 2 by an input signal $\omega_F$ from any suitable source. An output signal of frequency $\omega_F$ or $\omega_H$ may be derived at the right side of the figure directly from conductors 1 and 2 of the device 50 or in any other well-known manner.

Figure 3:
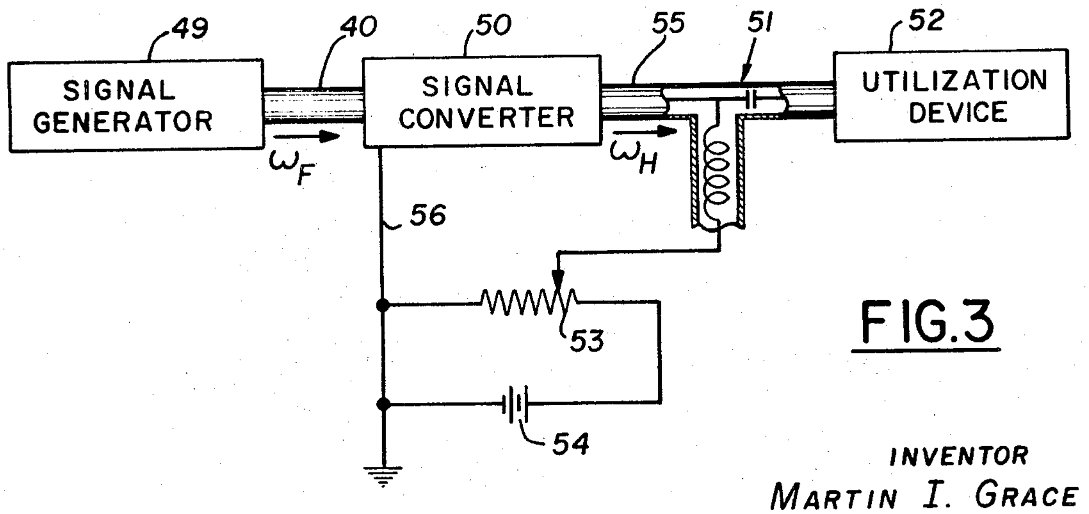
FIG. 3 is a block diagram showing how the apparatus of FIG. 1 may be connected in use.

Referring to FIGS. 1 and 3, a suitable unidirectional bias voltage is applied across the electrodes 8 and 9 of diode 7. One useful method is shown in FIG. 3, which also illustrates one form of apparatus for making use of the invention. A signal generator 49 furnishes high-frequency energy at frequency $\omega_F$ via transmission line 40, 41 to the novel signal generator or converter 50. The output signal is derived from converter 50 by a transmission line 55 which may simply comprise an extension of conductors 1 and 2. In line 55, the output signal passes through a conventional bias tee junction 51 and flows substantially undisturbed to any desired utilization device 52.

The roll of bias tee junction 51 is to supply a circuit path, completed by grounded circuit 56, for the application of the bias field across diode 7. The bias field so imposed may be selected by adjustment of potentiometer 53 across which voltage supply 54 is coupled.

The type of diode known generically as the avalanche transit time diode has been found to have characteristics needed for use in the invention as diode 7. It may be used either in the form known as the impact avalanche transit time diode, for which the accepted acronym is the IMPATT diode, or in the form of the trapped plasma avalanche triggered transit diode known as the TRAPATT diode. Diode 7 may be, for example, an epitaxial silicon or other PN or step or abrupt junction diode or a $PNN^+$ punch-through diode designed such that, with an electric field of suitable amplitude present, the field punches through a substrate at reverse breakdown. Such diodes have, for example, been described as being successfully formed by diffusing boron from a boron-nitride source into a phosphorous-doped epitaxial material on a heavily doped antimony substrate. The thickness of the epitaxial layer is varied by etching, prior to diffusion, to produce either the abrupt PN structure or the $PNN^+$structure.

Figure 2:
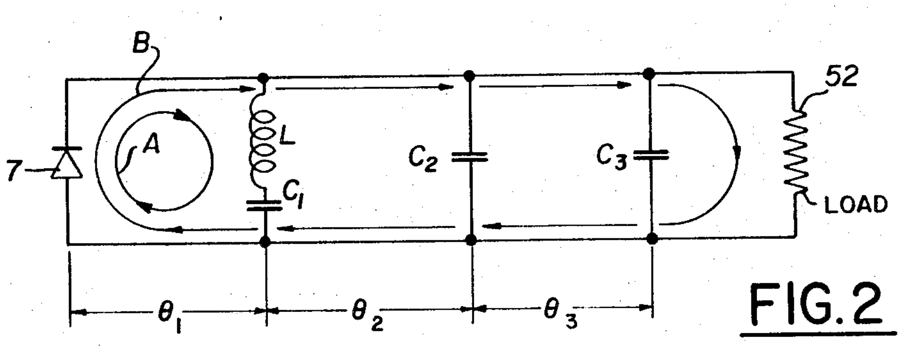
FIG. 2 is an equivalent circuit diagram useful in explaining the operation of the device of FIG. 1.

FIGS. 1, 2, and 3 will be used in further discussing one possible theory of operation of the invention. It should be observed that FIGS. 1 and 2 have been aligned one below the other in a particular way so that certain electrical reference planes bounding the phase angles $\theta_1$, $\theta_2$, and $\theta_3$ are aligned vertically. It should furthermore be observed that the lumped constant circuit of FIG. 2 is most nearly accurate in explaining operation of the invention when operating as an amplifier. Since the illustrative embodiment involves a distributed circuit, it is recognized not to be possible with strict accuracy to define its operation at harmonically spaced frequencies using a particular lumped constant equivalent circuit. It is therefore understood that the theory is offered only to illustrate in a general way the mode of operation of the invention.

Impedance transformer 10, as shown in FIG. 1, is one-quarter wave long for the incoming signal $\omega_F$ and is centered a distance $\theta_1$ from the plane of diode 7. On the other hand, impedance transformers 11 and 12 are each one-eighth of a wave long for signal $\omega_F$. Transformer 11 is centered a distance $\theta_2$ from the midplane of transformer 10, while transformer 12 is a distance $\theta_3$ from the midplane of transformer 11.

Transformer 10 is positioned substantially an electrical length $\theta_1$ from the plane of diode 7 such that the loop A is resonant at $\omega_F$ and all of its harmonics. The positions of the midplanes of impedance transformers 11 and 12; i.e., the values of $\theta_2$ and $\theta_3$, are set so that diode 7 finds itself in an extended loop B resonant at $n\omega_F$ or, for example, at $\omega_H$. The quantity $n$ is a positive integer including unity. As is seen in FIG. 3, the first transformer 10 acts as a band stop filter comprising condenser $C_1$ and inductor L at frequency $\omega_F$, tending in one adjustment to prevent energy of frequency $\omega_F$ from reaching the load. On the other hand, the transformer elements 11 and 12 are represented in FIG. 2 as respective condensers $C_2$ and $C_3$ with positions defined by the respective values of $\theta_2$ and $\theta_3$. The angles $\theta_2$ and $\theta_3$ may be set so as to permit flow of currents at frequency $\omega_F$ or of the harmonic signal $n\omega_F$ into load 52.

As previously noted, the input signal of frequency $\omega_F$ can be supplied to converter 50 in FIG. 1 via coaxial transmission line 40, 41 and coupling loop 35. A unidirectional bias field is applied across diode 7, being derived as previously explained, for example, from battery 54, potentiometer 53, and bias tee junction 51. Potentiometer 53 is adjusted so that the peak electric field across diode 7 is biased within a few volts of reverse breakdown.

In the quiescent state, with no input signal at frequency $\omega_F$, substantially no unidirectional current flows through diode 7, and substantially no power is wasted. Undesired power consumption and heating of diode 7 is thus avoided. When high-frequency energy at frequency $\omega_F$ is admitted to converter 50, the electric field across the junction of diode 7 is the sum of a unidirectional bias field component and the alternating field component of the high-frequency signal $\omega_F$. Whenever the time rate of increase and the peak total field across diode 7 exceed critical value, an avalanche shock wave is generated, causing the electric field within diode 7 to fall instantaneously to a very low value.

Consequently, a large current impulse is allowed to flow from battery 54 through diode 7. Current pulse peaks of amplitude of the order of 10 times the amplitude of the high-frequency signal $\omega_F$ have been experimentally observed. This current surge is abrupt and therefore has a rich harmonic content, so that a harmonic signal electric field of frequency $\omega_H$ can readily be coupled to loop B of the converter. Amplification of the signal obtains because the relatively small excursions of the $\omega_F$ signal that swing only a few volts relative to the breakdown voltage trigger a relatively larger swing in current flowing through diode 7. Because of the wide diode current swing from a value of substantially zero, amplification or frequency multiplication is an efficient process, a 30 percent DC to HF harmonic conversion efficiency having been experimentally observed at the second harmonic of 2.8 GHz. No power is lost in the absence of the signal $\omega_F$. Simple, readily adjusted circuit elements are thus employed to yield efficient energy conversion.

Figure 4:
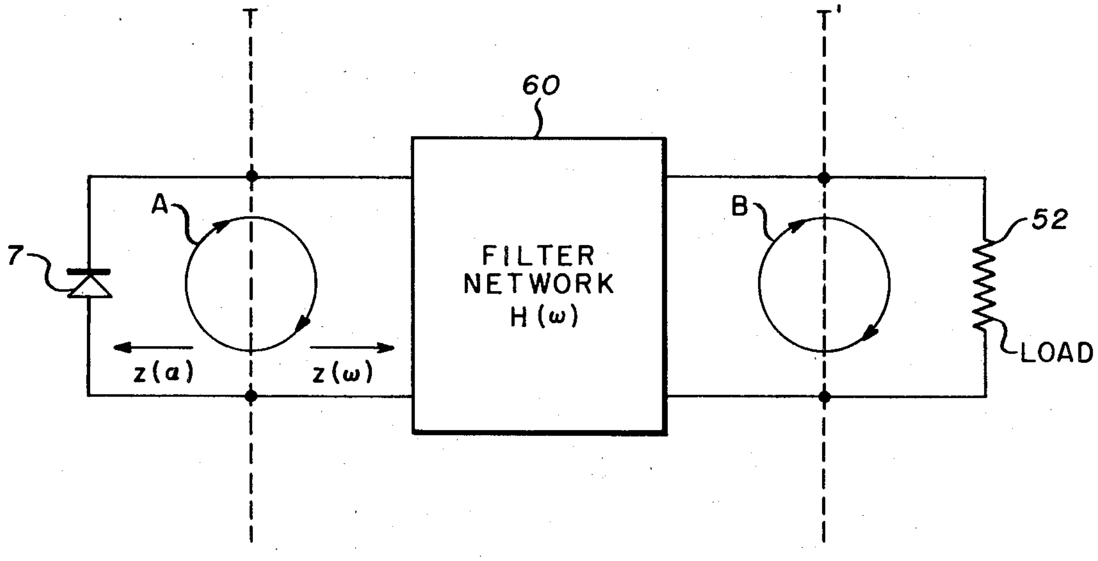
FIG. 4 is a similar to FIG. 2.

As noted in the discussion of FIG. 2, only an approximate approach can be offered thereby for explaining the operation of the circuit of FIG. 1 for harmonic generation as well as for amplification. FIG. 4 may be used in offering a more generally acceptable theory.

In FIG. 4, diode 7 is seen to be connected to an external load resistor 52 through a high-frequency filter network 60. Filter 60 is characterized by having an input impedance $Z(\omega)$ and a transfer function $H(\omega)$. Filter 60 is designed such that the input impedance $Z(\omega)$ is equal to the conjugate impedance $Z(a)$ of diode 7 at the input frequency $\omega_F$ and at all of its harmonics $n\omega_F$. This adjustment allows high-frequency current to flow through diode 7 at frequency $\omega_F$ and at all of its harmonics. The transfer function $H(\omega)$ is selected so that only the current at the harmonic output frequency $\omega_H$ flows in load resistor 52. It is understood that the output frequency can be the same as the input frequency $\omega_F$ or the same as any of its harmonics $n\omega_F$. The positions and lengths of the various tuning or matching elements in FIG. 1 are arranged to satisfy the requirements imposed upon $Z(\omega)$ and $H(\omega)$.

In operation of the device of FIG. 1, it is seen from FIG. 4 that an alternative means for extracting high-frequency energy from the apparatus is to place a known circulator device at the impedance reference plane T in FIG. 4. Such a device may be used in the amplifier mode of operation of the invention to separate the input and amplified output signals.

If the output frequency is the same as the input frequency, as in amplification, the transfer function $H(\omega_F)$ for the fundamental is unity and is zero for all harmonics. In the harmonic generation mode, where the output frequency occurs, say, at the $n$th harmonic of $\omega_F$, then the transfer function $H(n\omega_F)$ is unity, while the transfer function for the fundamental is zero.

While the invention has been described in its preferred embodiment, it is to be understood that the words that have been used are words of description rather than limitation and that changes within the purview of the appended claims may be made without departing from the true scope and spirit of the invention in its broader aspects.

I claim:

1. A high-frequency energy converter comprising:
hollow transmission line means adapted to supply output high-frequency signals,
conductive wall means for short circuiting said transmission line means adjacent one end thereof,
negative-resistance high-frequency avalanche diode means conductively bonded to said transmission line means adjacent said conductive wall means,
circuit means in series connection with said avalanche diode means for biasing said avalanche diode means with a unidirectional electric field below its characteristic breakdown field so that substantially no bias current flows through said avalanche diode means, means for supplying a high-frequency carrier field across said diode means superimposed upon said unidirectional electric field so that the total electric field across said diode means rises above a critical value, thereupon triggering bias current flow through said diode means for the purpose of exciting amplified high-frequency fields in said hollow transmission line means, first impedance transformer means within said hollow transmission line means adapted to produce substantially resonant carrier and harmonic frequency fields across said diode means in a first portion of said transmission line means, and second impedance transformer means within said hollow transmission line means adapted to cause resonance within a second portion of said transmission line means selectively to said carrier frequency or to one of its harmonics.

2. Apparatus as defined by claim 1 wherein said hollow transmission line means inner and outer conductors are coaxially related.

3. Apparatus as defined by claim 1 wherein said avalanche diode means is an impact avalanche transit time diode.

4. Apparatus as defined by claim 1 wherein said avalanche diode means is a trapped plasma avalanche triggered transit diode.

5. Apparatus as defined by claim 1 wherein a part of said impedance transformer means acts as a band stop filter for said high-frequency carrier for confining said high-frequency carrier field to a region in said transmission line adjacent said avalanche diode means.

6. Apparatus as defined by claim 1 wherein said impedance transformer means support dielectric means for supporting said inner conductor.

7. Apparatus as described in claim 1 wherein said second impedance transformer means comprises first and second spaced transformer elements.

8. Apparatus as described in claim 7 wherein said first impedance transformer means and said second and third spaced transformer elements each comprise a disk-shaped element having a periphery contacting said tubular outer conductor and having a central aperture for accommodating said inner conductor.

* * * * *